(12) United States Patent
Van Acht et al.

(10) Patent No.: US 8,081,523 B2
(45) Date of Patent: Dec. 20, 2011

(54) CIRCUIT WITH A MEMORY ARRAY AND A REFERENCE LEVEL GENERATOR CIRCUIT

(75) Inventors: Victor Martinus Van Acht, Waalre (NL); Nicolaas Lambert, Waalre (NL); Pierre Hermanus Woerlee, Valkenswaard (NL)

(73) Assignee: NXP B.V., Eindhoven (NL)

( * ) Notice: Subject to any disclaimer, the term of this patent is extended or adjusted under 35 U.S.C. 154(b) by 526 days.

(21) Appl. No.: 11/813,862

(22) PCT Filed: Jan. 5, 2006

(86) PCT No.: PCT/IB2006/050037
§ 371 (c)(1),
(2), (4) Date: Jan. 5, 2010

(87) PCT Pub. No.: WO2006/075262
PCT Pub. Date: Jul. 20, 2006

(65) Prior Publication Data
US 2010/0103751 A1    Apr. 29, 2010

(30) Foreign Application Priority Data
Jan. 12, 2005   (EP) ................................... 05100136

(51) Int. Cl.
*G11C 5/14*    (2006.01)
(52) U.S. Cl. ......... 365/189.09; 365/185.03; 365/185.05; 365/185.18; 365/185.2; 365/185.21; 365/189.15; 365/189.07; 365/230.06; 365/242

(58) Field of Classification Search ............. 365/185.03, 365/185.05, 185.18, 185.2, 185.21, 189.15, 365/189.07, 189.09, 230.06, 242
See application file for complete search history.

(56) References Cited

U.S. PATENT DOCUMENTS

| | | | |
|---|---|---|---|
| 6,222,762 B1 * | 4/2001 | Guterman et al. | 365/185.03 |
| 7,187,592 B2 * | 3/2007 | Guterman et al. | 365/189.15 |
| 7,203,112 B2 * | 4/2007 | Liaw | 365/209 |
| 2003/0031059 A1 * | 2/2003 | Endo et al. | 365/189.09 |
| 2004/0062116 A1 | 4/2004 | Takano et al. | |

* cited by examiner

*Primary Examiner* — Fernando N. Hidalgo

(57) ABSTRACT

A circuit comprises an array of memory cells (10). A plurality of sensing circuits (20), are coupled to the output (14) of respective memory cells (10), for comparing the output signal of the respective one of the memory cells (10) with a reference signal to form a data signal from the output signal from the respective one of the memory cells (10). A reference generator circuit (24, 26) forms the reference signal from a sum wherein each respective one of the memory cells (10) of the addressed group contributes a contribution that is a function of the output signal of the respective one of the memory cells (10). The contributions are equalized for output signal values at more than a saturating distance above the reference signal, and the contributions are equalized for output signal values at more than the saturating distance below the reference signal. In case of storage of multi-level data in the cells the distances from the central level to the saturation levels above and below the reference level are mutually different, with a ratio that corresponds to a ratio of the counts of cells that have been programmed to respective levels.

17 Claims, 6 Drawing Sheets

CIRCUIT WITH A MEMORY ARRAY AND A REFERENCE LEVEL GENERATOR CIRCUIT

Figure 1:
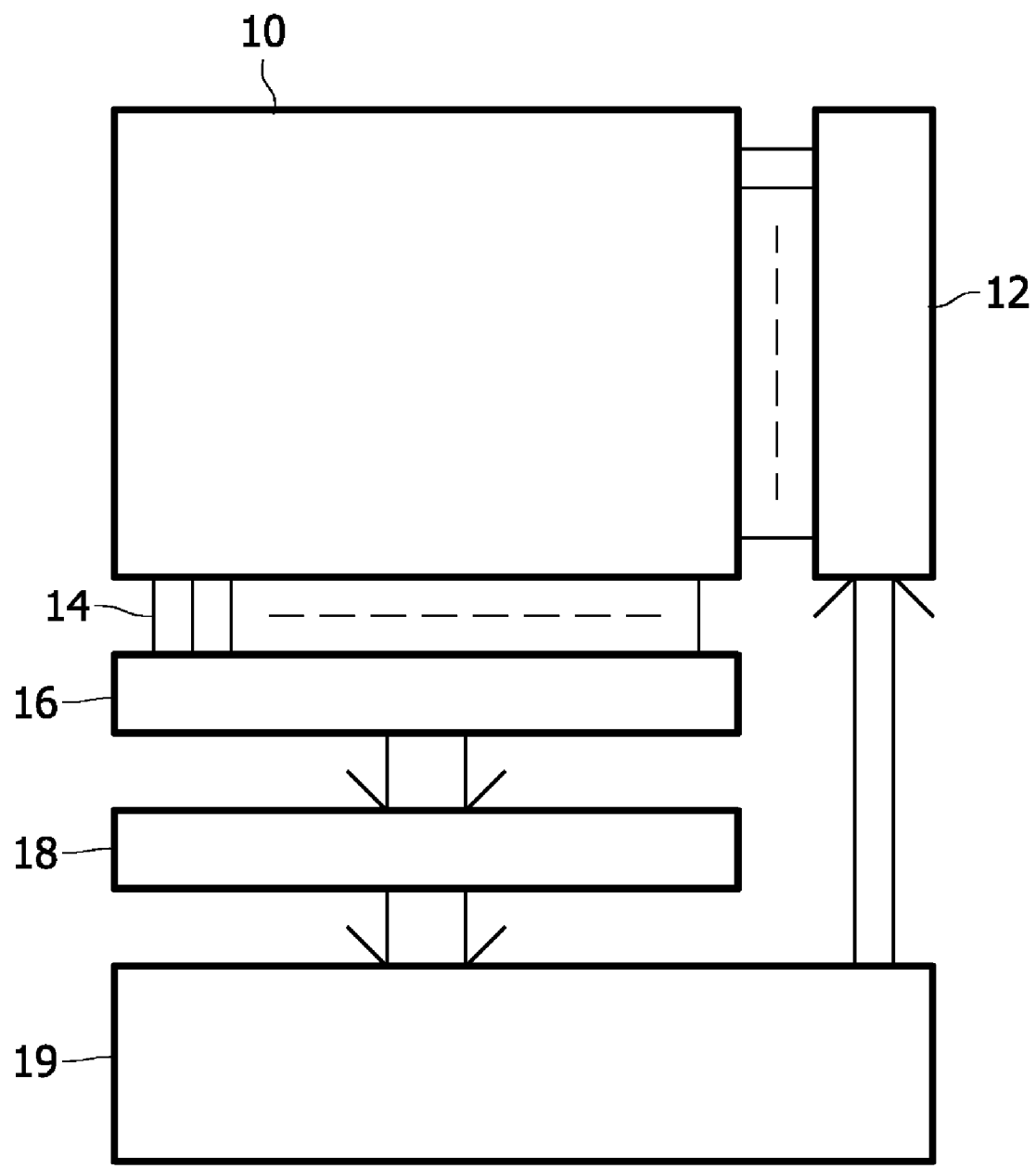

The invention relates to a circuit with a memory array, and a method of sensing a data content of cells in such a memory array.

U.S. Pat. No. 6,222,762 describes a semi-conductor circuit with a matrix of memory cells. Sensing circuits are provided for sensing information about data values that have been stored in the memory cells. Conventionally, each sensing circuit compares an output signal from a memory cells with a reference signal and outputs a binary signal that indicates whether the output signal level is above or below the reference signal level.

It is desirable to adjust the reference level to conditions in the circuit. Due to ageing or temperature variations, for example, a systematic shift may occur in the output signals. When the reference level is adapted to this shift, digital data can be recovered more reliably. The conventional solution for adapting the reference level is the use of reference memory cells. In this case the reference signal may be generated by averaging output signals from reference memory cells that store predetermined different data values, or by using a single reference memory cell with a "halfway" data value that is expected to result in an output signal with a level between the output signal levels for different data values.

U.S. Pat. No. 6,222,762 describes an implementation wherein A/D (Analog to Digital) converters are used to read the output signals from a plurality reference memory cells and from ordinary memory cells. A first data value is programmed into each of a first set of reference memory cells and a second data value is programmed into each of a second set of reference memory cells. Digitized output signal values are obtained for the reference memory cells of the two sets. Averages of the digitized output signal values of each of the two sets are computed and used to select the reference level for discriminating between output signal values for different data values from the ordinary memory cells.

The use of a plurality of reference cells that store the same nominal programmed value has the advantage that the effects of random variations can be eliminated. The more reference are used the better these effects can be eliminated. However, the use of a large number of reference cells that do not contribute to memory capacity is undesirable.

As an alternative the output signals from the memory cells that store data may be used to select the reference level. Of course, in this case no assumptions can be made about the programmed data in individual cells. But if the numbers of memory cells that store respective data values are known, irrespective of which particular cells store these data values, a threshold level can be selected by averaging the output signal values of the memory cells. For example if it is known that equal numbers of memory cells in a group of cells store logic one and zero data values respectively, the average of the output signals of the cells from this group is expected to be midway the output signal levels for logic ones and zeros, and such an average can be used as a threshold level.

However, it has been found that this does not always lead to satisfactory results. It has been found that there is a statistical possibility that some memory cells output extreme signal levels due to a failure, and that this affects the usefulness of the average for use as reference level.

Among others, it is an object of the invention to provide for a circuit with a memory array wherein the reference level is selected more reliably. Among others, it is an object of the invention to provide for a circuit with a memory array wherein more than two data values can be used to program a memory cell and wherein the reference level is selected more reliably.

A circuit according to the invention is set forth in claim 1. A reference level is selected using a sum of functions of the output signals of the memory cells from which data will be read. Typically, output signals from substantially a whole row of a memory matrix are used to compute this sum, but alternatively the sum may be computed from output signals for a part of a row of a matrix. Memory arrays are 'square' (for example: 1 Mbit memories have 1000 word lines and 1000 bit lines.) Functions are used that vary substantially only for output signal values that are within a saturating distance from the reference level. The functions equalize contributions for output signal values at more than a saturating distance above the reference signal, and more than the saturating distance below the reference signal. Thus, extreme variations in the output signal do not affect the selection of the reference signal. Preferably the function varies substantially linearly as a function of output signals over at least half of a range between the nominal output signals between which the reference signal distinguishes. This prevents that small variations in output signals around the reference signal can have a large effect on the reference signal.

In an embodiment the cells are programmable to levels selected from L different logic levels, L being an integer greater than two, (L=4 for example). In this case the reference signal lies between nominal output signals for a pair of two adjacent logic levels from the L logic levels. In this case it is preferably ensured that nominal output signals corresponding to all logic levels below the reference level, except optionally the adjacent lower level, contribute substantially the same contribution to the sum. Similarly, it is preferably ensured that nominal output signal levels corresponding to all logic levels above the reference level, except possibly the adjacent higher level contribute substantially the same contribution to the sum. That is, when the nominal output signal levels for different logic levels are evenly spaced, the saturation distance is at most one and a half times the distance between a pair of nominal output signal levels, and preferably of substantially half this distance.

The memory is accessed on a word by word basis by addressing words. Typically a word includes information from substantially a whole row of the matrix, but alternatively each word may contain information from a group of cells that forms an addressable fraction of a row, for example substantially half a row, a quarter of a row etc.

Preferably the memory stores words wherein each logic level occurs a respective predetermined number of times, only the positions in the word of the cells that store these logic levels being data dependent. In this case, for a reference level that lies between nominal output signals for adjacent logic levels, predetermined numbers Nlow and Nhigh are known, respectively of the number of cells that store logic levels that lead to nominal output signals below and above the reference level. In this case the contributions to the sum are preferably selected so that the ratio Chigh/Clow between the saturated contribution Chigh from output signals above the reference signal to the saturated contribution Clow from output signals below the reference signal is substantially equal to the ratio Nlow/Nhigh. That is, for different reference levels different ratios are preferably used. In this way different reference levels can be selected without suffering from extreme variations in the output signals.

Typically the number of cells that store a logic level is approximately N/L (N being the number of cells in a word, N=512 or N=2048 for example) In this case the ratio between the Chigh and Clow for determining the reference level to distinguish between k lower logic levels and L−k higher logic levels is substantially equal to k/(L−k).

Preferably, a feed back loop is used to regulate the reference signal, so that the contributions to the sum are functions of the difference between the output signals and the fed back reference level. In this way a wider range of output signal shift can be handled than when feed forward selection of the reference level as a function of the output signals is used. Preferably, the feedback loop has an integrating transfer function, this makes it possible to use relatively uncomplicated circuits. An integrating transfer function ensures that exactly the right reference level will be found. It a further embodiment the integrating transfer function implements a "PID-controller" (proportional, integrating, differentiating) so that the frequency response of the feedback loop can be tuned. PID controllers are known per se.

In an embodiment the reference generator circuit comprises saturating circuits, each with an input coupled to a respective one of the bit lines, and a summing circuit with inputs coupled to the saturating circuits and arranged to sum contributions from the saturating circuits to control the reference signal. In this way the desired behaviour is realized with a simple circuit.

Preferably, at least part of the saturating circuits each comprise a differential pair of transistors, with sources coupled to a current source. The size of the current from the current source and the transistors can be used to realize the saturating behaviour. Preferably the summing circuit comprises a current subtraction circuit, arranged to subtract a current in proportion to a first current from the drain electrode of the first transistor from a current in proportion to a second current from the drain electrode of the second transistor, an output of the subtraction circuit being coupled to the sensing circuit for controlling the reference signal. Before subtraction the currents for different bit lines may be summed. A current mirror may be used for example to feed a mirrored copy of the first current to a node that receives the second current.

In an embodiment the subtraction circuit is arranged so that a first ratio between the current in proportion to the first current and the current in proportion to a second current differs from a second ratio between the first and second current. In this way different saturation levels are realized for output signals well above and well below the reference signals.

In a further embodiment the sensing circuits makes use of the saturating circuits that are also used for generating the reference voltage. In this case the sensing circuits comprise a current subtraction circuit, arranged to subtract a current from the drain electrode of the first transistor from a current from the drain electrode of the second transistor, an output of the subtraction circuit being coupled to a data output of the sensing circuit.

These and other objects and advantageous aspects of the invention will be described using non-limitative examples by reference to the following figures.

Figure 2:
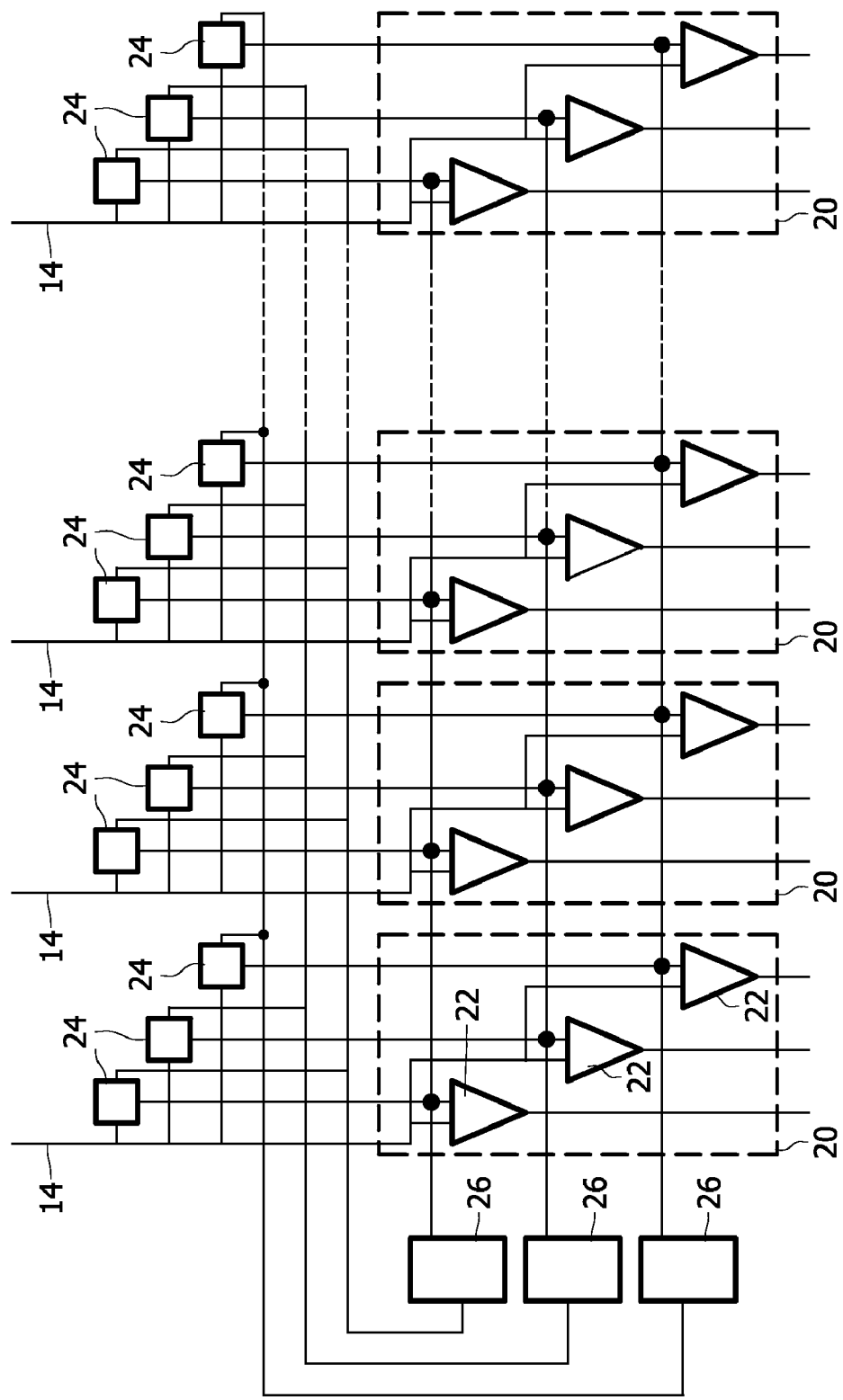
Figure 3:
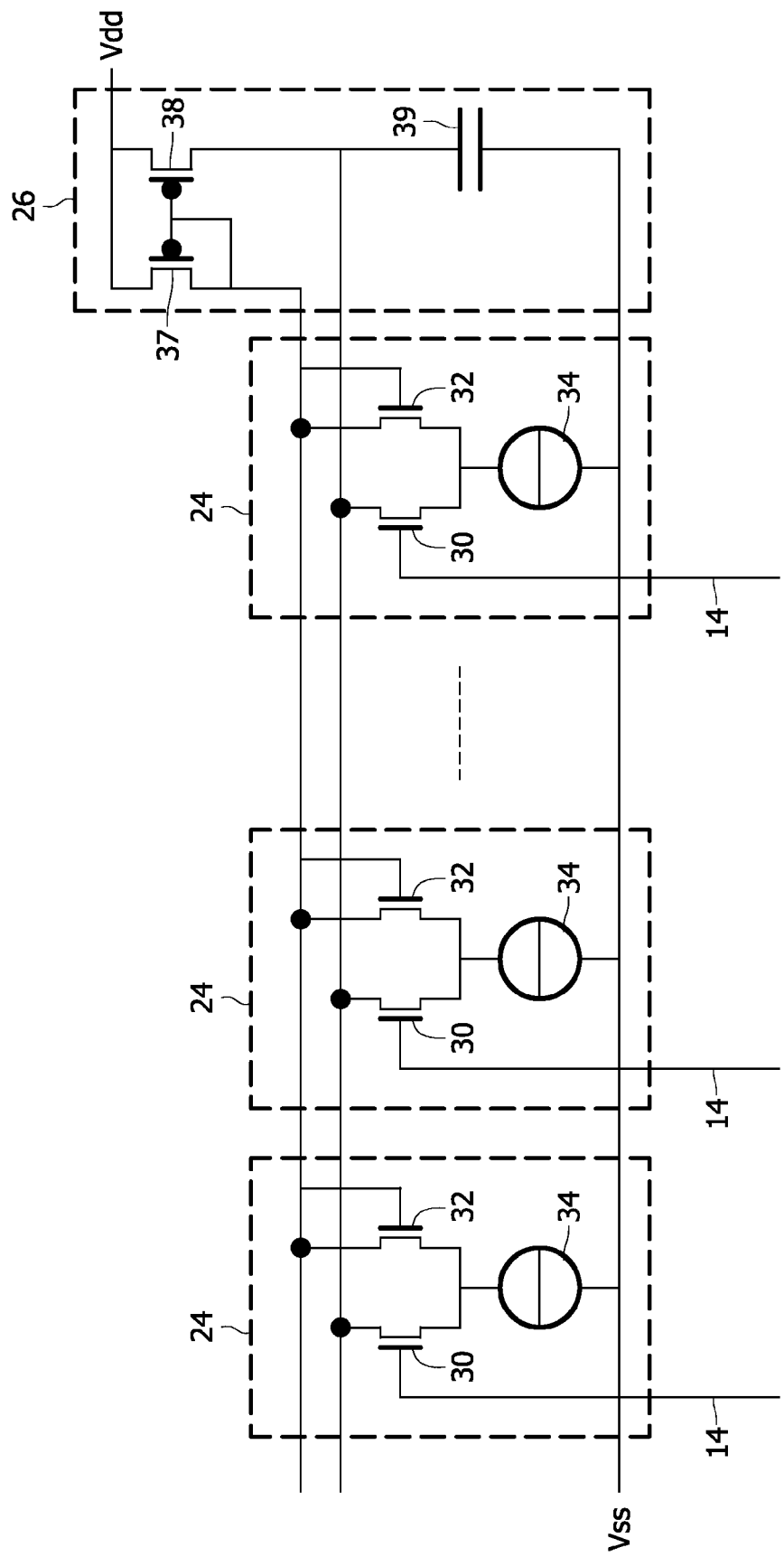
Figure 4:
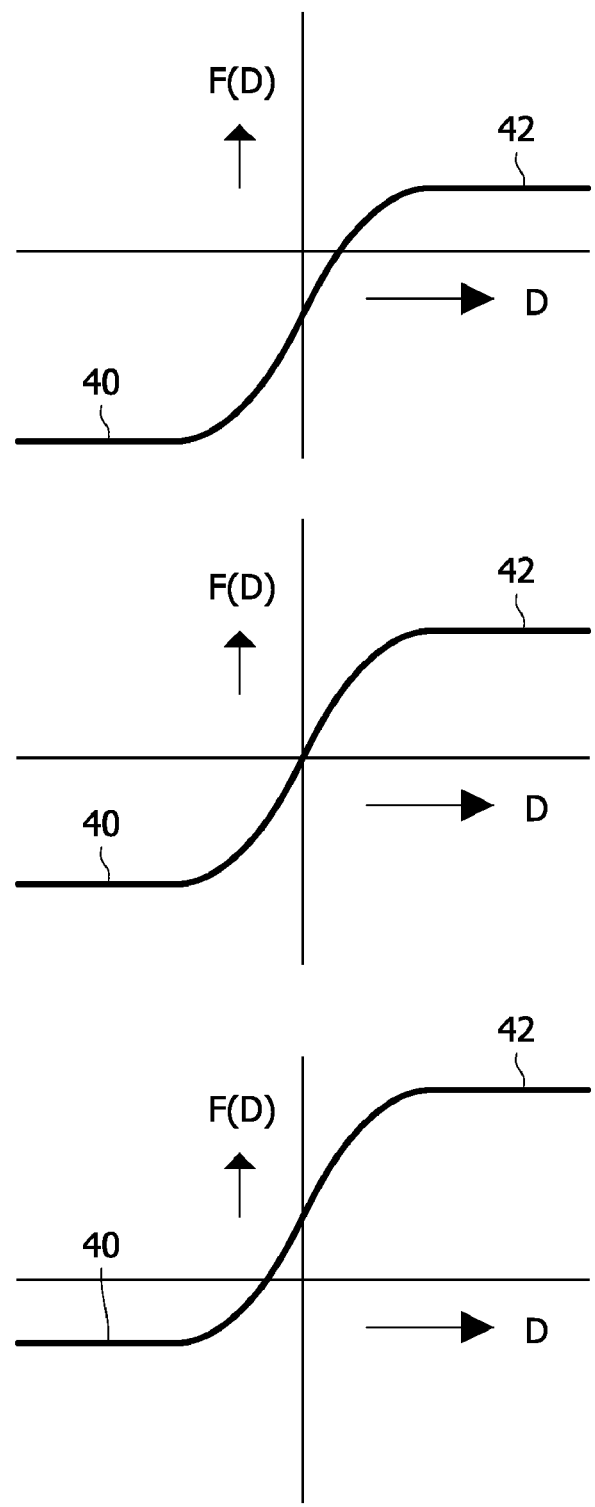
Figure 5:
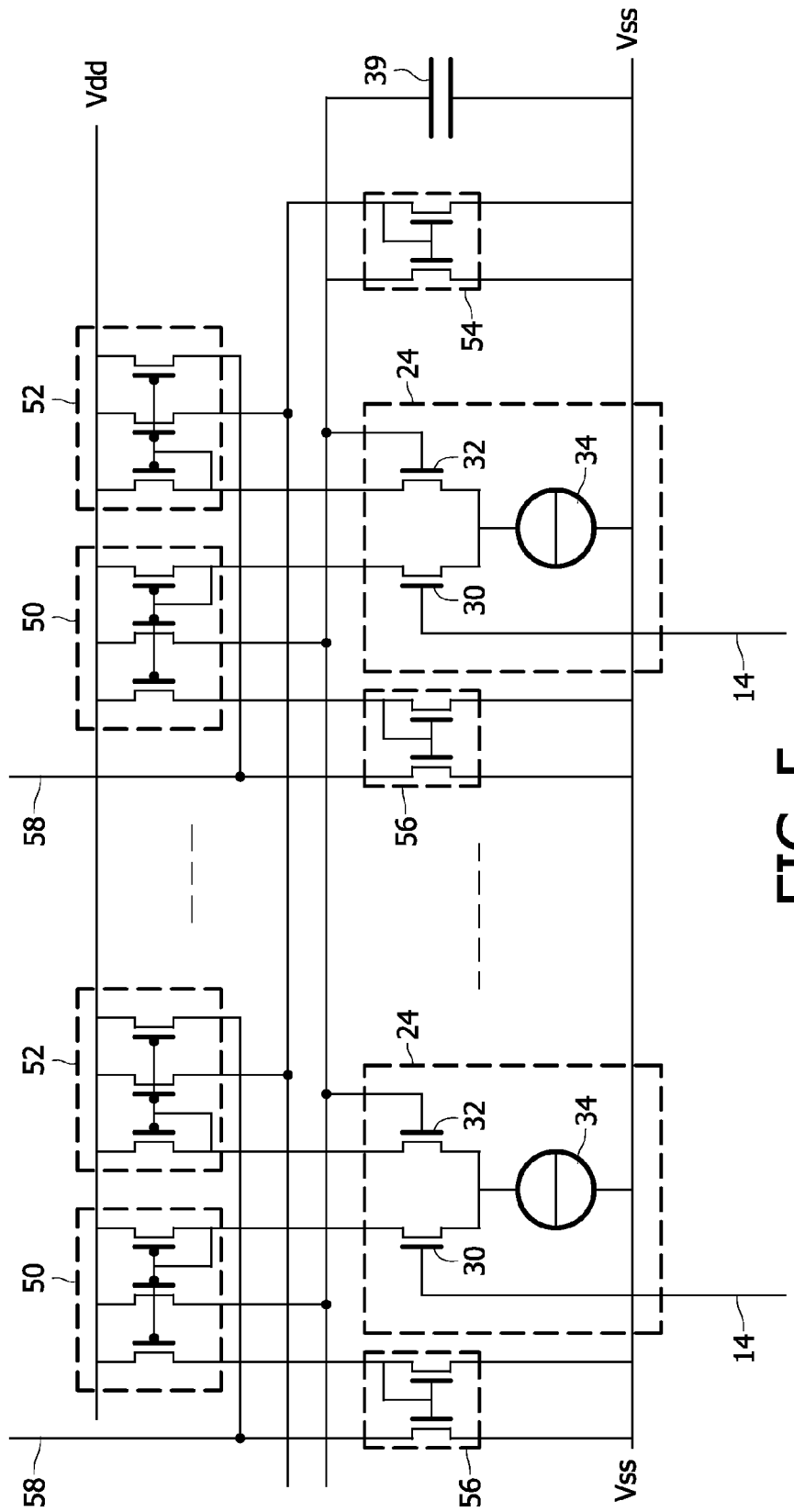
Figure 6A:
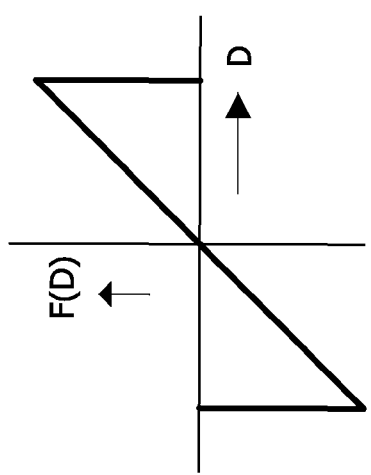
Figure 6B:
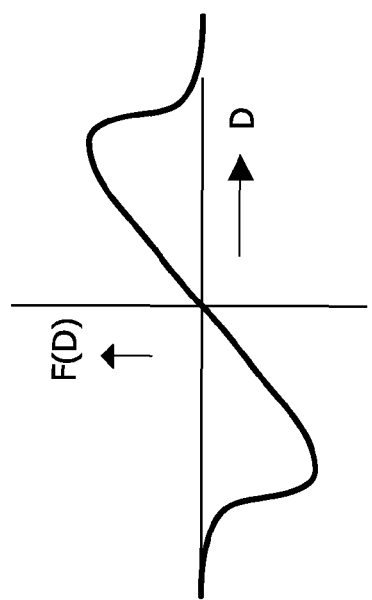
Figure 6C:
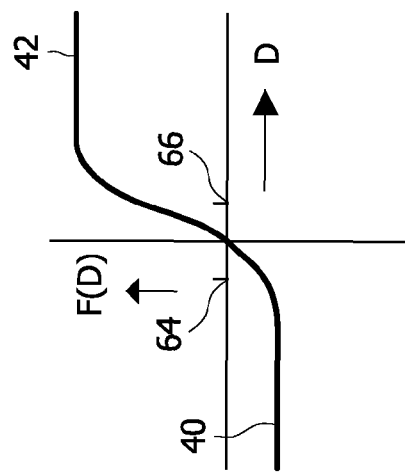

FIG. 1 shows an electronic circuit
FIG. 2 shows a sensing circuit
FIG. 3 shows a reference generator circuit
FIG. 4 illustrates a net current contribution
FIG. 5 shows combined saturating circuits and comparators
FIG. 6a-c illustrates alternative net current contributions FIG. 1 shows an electronic circuit, comprising a memory matrix 10, an addressing circuit 12, bit lines 14, sensing circuits 16, and error correction circuit 18 and a data processing circuit 19. Data processing circuit 19 has an address output coupled to addressing circuit 12, which has selection lines coupled to rows of memory cells in memory matrix 10. Outputs of memory cells in respective columns of memory matrix 10 are coupled to respective bit lines 14. Although only a few bit lines 14 are shown explicitly, it should be understood that in practice a large number of bit lines, for example 512 or 2048 bit lines (or slightly more bit lines to allow for error correction of the 512 or 2048 bits) may be coupled to cells in matrix 10. Bit lines 14 are coupled to sensing circuits 16, which have outputs coupled to error correction circuit 18. Error correction circuits 18 have data outputs coupled to data processing circuit 19. Typically, all parts of the circuit of FIG. 1 except data processing circuit 19 will be implemented in a single integrated circuit. However, without deviating from the invention error correction circuit 18 may be implemented outside such an integrated circuit or data processing circuit 19 may be implemented in such an integrated circuit for example.

FIG. 2 shows a sensing circuit 16. Sensing circuit 16 comprises a plurality of sets 20 of comparators 22, each set containing a first, second and third comparator 22, saturating circuits 24 and summing circuits 26. Each set 20 of comparators 22 is assigned to a respective one of bit lines 14. In each set 20, a first input of each comparator 22 is coupled to the respective one of the bit lines 14 that is assigned to the set 20. Bit lines 14 are coupled to first inputs of saturating circuits 24.

Saturating circuits 24 and summing circuits 26 form a reference generator circuit. Saturating circuits 24 have outputs coupled to inputs of summing circuits 26. For each bit line a set of saturating circuits is provided, each coupled to a respective one of the summing circuits. Although single connecting lines are shown, it should be understood that each saturating circuit 24 may have its own connection to summing circuit 26, alternatively current summing, using one or more common inputs may be used. Although localized summing circuits 26 are shown it should be understood that each summing circuit 26 may in fact be a distributed circuit with components near respective ones of bit lines 14. Summing circuits 26 have outputs coupled to second inputs of the first, second and third comparators 22 of all sets 20 respectively. Furthermore the output of each summing circuit 26 is coupled to second inputs of the saturating circuits 24 that supply output signals to that summing circuit 26.

In operation data processing circuit 19 supplies addresses to addressing circuit 12, which generates selection signals for rows of cells in memory matrix 10. In response to each selection signal the cells of the selected row applies a signal to a respective one of the bit lines 14. Sensing circuits 16 compare the resulting signals in bit lines 14 with a plurality of reference signals, and produces digital comparison results. Error correction circuit 18 uses the comparison results to reconstruct digital data values, correcting errors if necessary, and supplies the digital data to the data processing circuit. Any type of error correction may be used. In an embodiment, for example, a q-ary symbol based error correcting code (q>2), like a Reed Solomon code may be used, wherein a plurality of bits that are obtained from a same cell are placed in a symbol of the error correcting code. This has the advantage that combined bit errors due to a completely erroneous cell do not reduce the error correction capacity. This error correction technique can be applied also when the reference levels are not determined by averaging as described herein.

By way of example a circuit has been shown that is used for storing two bits per memory cell, by programming each cell to one of four possible levels. As a result, each output signal on any bit line 14 nominally assumes one of four output values. In practice, however, the output signals at individual bit lines 14 may deviate from the nominal levels, leading to a statistical spread in the actual output signal levels. Sensing circuit 16 allows for such spread by comparing the output signals with a plurality of reference levels in comparators 22. The reference levels should have values substantially midway between adjacent pairs of nominal values.

However, the nominal values themselves can also vary, due to temperature changes, wear etc. As a result, there will be changes in the average of the output signals of bit lines 14 that are coupled to memory cells wherein identical bits have been stored. In order to compensate for the variations in the nominal output signal values the reference levels for comparators 22 are adjusted.

The reference levels for comparators 22 are determined by summing circuits 26. Before the comparison results are captured for processing by error correction circuit 18, the reference levels for the comparison are adjusted.

FIG. 3 shows an embodiment of a reference generator circuit that contains a combination of saturating circuits 24 and summing circuits 26. In this embodiment each saturating circuit contains a first transistor 30 and a second transistor 32, coupled as a differential pair, with connected source electrodes. A current source circuit 34 is coupled between the connected source electrodes and ground. The gate electrodes of first transistors 30 are coupled to respective ones of bit lines 14. The gate electrodes of second transistors 32 receive the reference voltage from the associated summing circuit 26. The drain electrodes of first transistors 30 of all saturating circuits 24 are interconnected, and coupled to a first input of summing circuit 26. Similarly the drain electrodes of second transistors 32 of all saturating circuits 24 are interconnected and coupled to a second input of summing circuit 26.

Summing circuit 26 contains a third and fourth transistor 37, 38 and a capacitance 39. Third and fourth transistor 37, 38 are coupled to form a current mirror circuit, with an input coupled to the interconnected drains of the first transistors 30 of saturating circuits 24 and an output coupled to the interconnected drains of the second transistors 32 of saturating circuits 24. Capacitance 39 has a first terminal coupled to the output of the current mirror and a second terminal coupled to ground. The output of the current mirror supplies the reference voltage and is coupled to the gates of second transistors 32 of saturating circuits 24.

Respective circuit combinations of the type shown in FIG. 3 are provided for each reference voltage. When four logic levels are used, for example, three reference levels are used, three circuits of the type shown in FIG. 3 supplying the reference voltages.

Although the same type of circuit is used for the different reference levels, the circuits mutually differ with respect to the amount of imbalance between the third and fourth transistor 37, 38, that is, with respect to the gain of the current mirror. When there are L logic levels (L=4 for example) and the reference levels between these logic levels are labelled k=1 . . . (L−1) with increasing k for increasingly high reference voltages, then there is a ratio of (L−k): k between the W/L ratio's of the third and fourth transistors 37, 38 in the summing circuit 26, i.e. between the input and output of the current mirror. Thus the gain of the current mirror is k/(L−k) for the circuit for reference level k.

In operation the voltage difference between the voltage at a bit line 14 and the reference voltage determines how the current I from current source circuit 34 is distributed over first and second transistor 30, 32. When the voltage at a bit line 14 is much higher than the reference voltage, substantially all of current I flows through the first transistor 30 that has its gate coupled to the bit line 14. As a result a current contribution of kI/(L−k) flows to capacitance 39. When the voltage at a bit line 14 is much lower than the reference voltage, substantially all current flows through the second transistor 32 that has its gate coupled to the reference voltage. As a result a current contribution of I flows to capacitance 39. Thus, in the circuit for producing the kth reference voltage the net current contribution at capacitance 39 varies from −I to kI/(L−k), dependent on the difference between the voltage at a bit line 14 and the reference voltage.

In the case of four logic levels (three reference levels), for example the current contribution varies from −1 to ⅓ in the circuit for the lowest reference voltage, from −½ to ½ in the circuit for the middle reference voltage and from −⅓ to 1 in the circuit for the highest reference voltage.

FIG. 4 illustrates the net current contribution at capacitance 39 as a function of the voltage difference between a bit line voltage and the reference voltage for three reference levels in the case of four logic levels (L=4). As can be seen the high and low saturation values 40, 42 are different. Over a transition range of voltage differences the net current contribution varies approximately linearly over more than half the difference between the minimum to the maximum net current. The width of this transition range has been selected so that it is approximately equal to the difference between adjacent logic levels. The width of the transition range depends on the current $I_o$ from current source 30 divided by the transconductance factor beta of the first and second transistors 30, 32. Either can be set to provide the desired width of the transition range.

With the embodiment of FIG. 3, due to capacitance 39 the circuit functions as an integrating feed back loop, which regulates the reference voltage so that the net current to capacitance 39 becomes zero. This results in a reference level between adjacent logic levels, when the data in memory matrix 10 has been selected so that each of the L logic levels occurs substantially the same number of times (N/L times, where N is the number of bit lines 14). In this case, for the circuit for reference level k, there are k*N/L bit lines with a logic level below reference level k and (L−k)*N/L bit lines with a logic level above reference level k.

The circuit regulates the reference level so that the k*N/L current contributions (of minimally −I) due to bit lines 14 with the lower logic levels and the (L−k)*N/L current contributions (of maximally k*I/(L−k))) due to bit lines 14 with the higher levels result in a net zero current at capacitor 39. As can be noted, the gain of the current mirror has been selected so that a zero net current $$0=(L-k)*k*I/(L-k)-k*N*I$$

results if the maximal and minimal current contributions would occur for all bit lines 14. However, in practice, substantially maximal and minimal contributions occur only for bit lines with logic levels that are not adjacent to the reference level.

The effect of this selection of the width of the transition range is that, when the reference voltage is higher than approximately midway between the adjacent higher and the lower logic levels, the net current contribution at capacitance 39 due to the bit lines with adjacent higher logic levels will drop, which results a lowering reference voltage at capacitance 39. In the contrary case, when the reference voltage becomes lower than approximately midway between the adjacent higher and the lower logic levels, the net (negative) current contribution at capacitance 39 due to the bit lines with adjacent lower logic levels will drop, which results in a rising reference voltage at capacitance 39.

A stable reference voltage is reached when these effects compensate each other. It may be noted that the stable reference voltage between two adjacent logic levels is not necessarily exactly midway the adjacent logic levels. When the gain of the current mirror is greater than one the stable reference voltage will tend to be shifted towards the higher logic level and vice versa when the gain of the current mirror is less than one the stable reference voltage will tend to be shifted towards the lower logic level.

Preferably, large third and fourth transistors 37, 38 are used, with a W/L ratio that are of the order of magnitude of N times the W/L ratio of first transistors 30 (N being the number of first transistors that is connected to third transistor 37). This prevents MOS saturation effects at the third and fourth transistors 37, 38. Instead N third transistors of a size of the order of magnitude of first transistors 30 may be used in parallel. The same goes for fourth transistor 38. Loop gain and speed depend on the size of the transistors and the capacitance value of capacitor 39. The capacitance value of capacitor 39 is preferably selected dependent on a desired loop gain and speed. Typically, the capacitance value too will be proportional to N, so that a relatively large capacitance is needed when many bit lines 14 are used to select the reference level.

Comparators 22 are preferably implemented with a circuit that is similar to saturation circuit, using a differential pair of transistors and a current source. In an embodiment, comparators 22 are distinct from saturating circuits 24.

FIG. 5 shows an embodiment wherein saturating circuits 24 and comparators 22 have been partly combined. In this embodiment the drains of first and second transistor 30, 32 of different saturating circuits are not coupled directly. Instead a first and second current mirror 50, 52 are provided for each bit line 14, with inputs coupled to the drain of first and second transistor 30, 32 for the bit line. Both the first and the second current mirror 50, 52 have two outputs. First outputs of the first current mirrors are used for generating the reference voltage and second outputs are used for detection of the logic levels.

First outputs of the first current mirrors 50 for different bit lines 14 are coupled in common to the input of a first further current mirror 54. First outputs of the second current mirrors 52 for different bit lines 14 are coupled in common to the output of first further current mirror 54, which is coupled to capacitance 39 for generating the reference voltage.

Second outputs of respective first current mirrors 50 for different bit lines 14 are coupled to the input of respective second further current mirrors 56. Second outputs of respective second current mirrors 52 for different bit lines 14 are coupled to the output of respective second further current mirrors 56. Connections 58 between the output of respective second current mirrors 52 and the respective second further current mirrors 56 form the detection outputs of the comparators.

Of course the invention is not limited to the circuits that have been shown. For example, even if separate comparators 22 are used, a structure like that of FIG. 5, with multiple current mirrors may be used for generating the reference voltage. In this embodiment the size of the output transistors in the first, second and further current mirror, as well as the capacitance need not be selected in proportion to N. Instead, a relatively small predetermined size may be used. Similarly, a plurality of first, second and further current mirrors may be used, where the first and second current mirrors share input transistors but have separate output transistors. In this case the connected outputs of the second and further current mirrors may be coupled to provide respective reference voltages for different bit lines. A single shared current stage, wherein the currents for different bit lines 14 are summed, suffices: there is no need to have shared circuits for all bit lines 14 all the way.

Furthermore, although in the embodiment the saturating behaviour is realized by means of a differential amplifier that saturates because of source current limitation, it should be realized that saturating behaviour can be realized in other ways, for example using an essentially linear differential pair amplifier with non-linear saturating load circuits. In this case a voltage derived from the voltage difference between the load circuits may be used to control the reference voltage. The imbalance between the saturating levels can also be realized in different ways, for example by including an additional transistor with terminals, except its drain, coupled to corresponding terminals of first or second transistor 30, 32, and a drain coupled to the power supply. As another alternative, if saturating loads are used in a linear differential amplifier, loads with different saturation levels may be used.

Furthermore, although an embodiment with an integrating feedback loop has been shown, it should be appreciated that other types of feedback loop may be used. For example, a proportional feedback loop may be used, which can be realized by using a resistive load instead of capacitance 39, or by connecting third and fourth transistor 37, 38 as resistive loads. In this case one or more amplifier circuits may be connected between the resistive loads and the output for the reference voltage, to realize a desired loop gain.

In another embodiment a feed forward arrangement may be used. The embodiments of such feed forward circuits may be similar to those for the feedback arrangement, except that no coupling is provided between the output for the reference voltage and the gates of second transistors 32. Instead a predetermined pre-estimated reference voltage is applied in this case. In such a feed forward arrangement an accurately designed gain is required, so that the contribution of each bit line 14 to the reference voltage, when the bit line voltage is far away from the reference voltage, is $$(L-k)(k*(L-k)*N) \text{ if } V\text{bit} \ll V\text{ref}$$

$$k/((k*(L-k)*N) \text{ if } V\text{bit} \gg V\text{ref}$$

Compared to the feed forward arrangement, the advantage of a feedback loop arrangement is that the transition range shifts with the changes in the reference voltage, with the result that adjustment of the reference voltage over a wider range is possible. Moreover an accurately determined gain is not required.

It should be appreciated that the invention is not limited to circuits with the saturation behaviour shown in FIG. 4. FIGS. 6*a-c* illustrate alternative types of saturation behaviour that may be used.

FIG. 6*a* illustrates the contribution to the sum due to a bit line voltage, as a function of the difference D between the bit line voltage and the reference voltage. The contribution is zero above a higher cut-off difference and below a lower cut-off difference and proportional to the difference D between the cut-offs. The cut-offs are approximately twice the distance between nominal logic levels at bit lines 14 apart and are centred around zero difference. This type of behaviour may be realized for example by means of a pair of comparators for detecting whether the difference is below or above the cut-offs and a proportional circuit that produces an output in proportion to the difference unless it is forced to produce a zero output by the comparators when the difference is below the lower cut-off or above the higher cut off, e.g. by using a circuit like that of FIG. 3 and by cutting of the current from current source 34.

FIG. 6*b* shows an alternative contribution to the sum due to a bit line voltage. Herein too the contribution vanishes to zero when the difference is far from zero. In an intermediate range around zero difference non-zero contributions occur. Near zero the contribution is proportional to the difference D, reaching an extreme near the positions that occur for nominal logic levels and diminishing for a larger amplitude of the difference D. This type of behaviour may be realized for example by means of a detection circuit for generating a signal dependent on the amplitude of the difference D, the detection circuit controlling current source 34 to diminish the current supplied by current source 30 for large amplitudes.

This type of circuit effectively determines the reference voltage for distinguishing between adjacent logic levels by means of the bit line signals that carry these adjacent logic levels, ignoring other bit lines. This has the advantage that these adjacent logic level have equal weight, so that an unbiased reference voltage is produced. However, it has been found that spread in the logic levels can result in unpredictable contributions of output signals that result in differences near where the contribution drops off. This is effectively prevented by the type of contribution that is shown in FIG. 4. Herein the effects of non-adjacent logic level above and below the reference levels effectively cancel, so that no cut-off is needed. Also a wide range of initial values of the reference level is made possible, because it is prevented that the reference level gets stuck in local minima in the feedback loop. As a result, the capacitors in the feedback loop can be completely discharged (as they are when the system is powered up) and the feedback loop automatically and always converges the reference levels to their appropriate values.

FIG. 6*c* shows a further alternative wherein the contribution for positive and negative differences D is different. The contribution has been selected so that substantially the same deviation from the nearest saturation levels 40, 42 occur near the positions 64, 66 that corresponds to the adjacent nominal logic levels. That is the contribution is approximately Min+deviation(D) near next lower logic level Max−deviation(D) near next higher logic level As a result cross-over is needed between these positions near D=0, i.e. where the bit line voltage equals the reference voltage, but the exact nature of this cross-over does not significantly affect the operation of the circuit, since bit lines will only exceptionally output voltages near the reference level.

It should be appreciated that invention is not limited to the embodiments that have been shown. For example although an embodiment has been described wherein a respective circuits is provided for generating each reference voltage, it should be appreciated that instead a smaller number of circuits may be used. For example, if it may be relied upon that the distances between the reference voltages are equal, then it suffices to provide circuits for determining two reference levels from the bit line signals, further circuits determining the other reference levels by adding the distance between the obtained reference voltages to the obtained reference voltages. In this case it is also possible to use a summing circuit that sums currents from saturating circuits 24 that compare with mutually different reference levels in a feedback loop for the determination of the distance between the reference voltages. Similarly, if it may be relied upon that the reference voltages are disposed symmetrically around a central level, the reference voltages may be determined by adding and/or subtracting distances to this central level that have been determined from the output signals to the central level.

Furthermore, although an example has been given for the case wherein the data has been selected so that memory cells that are addressed together that store respective logic data values with substantially equal frequency, it should be appreciated that other embodiments are possible wherein other predetermined frequencies $f_k$ of cells with logic level k are used. In this case, in the embodiment of FIG. 3, the saturation levels are preferably adapted so that the ratio of the upper level to the lower level of the saturating function for a reference voltage k equals the ratio of the sum of the frequencies of the logic levels with levels above k to the sum of the frequencies of the logic levels with levels below k.

Furthermore, although examples have been given for the case that each cell stores one of four levels, it should be appreciated that larger or smaller numbers of logic levels may be used. At one extreme two logic levels may be used (binary data). In this case the saturating function ensures that bit lines signals that are way off from the nominal levels do not seriously disturb the selected reference voltage.

Furthermore, although an embodiment has been described wherein wherein both the input signals and the output signals of the sensing circuit are voltages, it should be understood that instead currents may be used as input signals and/or as output signals. For example, saturating current amplifying circuits are known per se, and could be used instead of the combination of first and second transistor.

Furthermore, although an embodiment has been shown wherein the output signals are compared with different reference voltages simultaneously, in an alternative embodiment the output signal is compared with different reference voltages successively. In this case, the same comparator/saturating/summing circuits may be used for different reference voltages, but in the case of the saturating circuits, a switchable imbalance should be implemented, for example by using a plurality of transistors in parallel in the current mirror formed by third and fourth transistor 37, 38, so that selected ones of these parallel transistors can be enabled and disabled dependent on which one of the reference voltages is determined.

Preferably each group (e.g. row) of cells that can be addressed together contains data that satisfies the same predetermined constraints in terms of counts of cells in the group that store respective logic levels. Preferably also the constraints require equal counts for all logic levels. However the invention is not limited to this particular type of constraint. For example, instead of exactly equal counts, a more relaxed requirement on the counts may be used, as long as it is still possible to reconstruct the reference levels from the programmed signals. If the counts satisfy this condition they will be said to satisfy the requirements substantially. Furthermore, the requirements may require different counts for different reference levels. As indicated, the saturation levels should be adapted in this case. Furthermore, different requirements may even be used for different addresses. In this case, the imbalance between the saturation levels is preferably adapted dependent on the address or on other information (e.g. as a function of the number of times that data has been read or written).

Furthermore, although an embodiment has been described wherein the reference voltages are determined continuously, for each addressed word, it should be appreciated that alternatively it is possible to add a sample and hold circuit, for holding the threshold voltages fixed, for example during a transition interval between reading from successive addresses, or even during reading from one or more addresses, after the reference voltages have been captured while the memory matrix produced output signals for a preceding address.

Furthermore, although preferably contributions from all simultaneously addressed cells (typically all cells in a row of the memory matrix) are used in the sum to form the reference voltages, alternatively only part of the addressed cells may be used, provided that the numbers of cells among these cells that store respective logic levels satisfy predetermined constraints.

The invention claimed is:

1. A circuit with a memory array, comprising
an array of memory cells, each cell having an output for producing an output signal;
a plurality of sensing circuits, each at least coupled to the output of a respective one of the memory cells from a jointly addressable group of the memory cells, for comparing the output signal of the respective one of the memory cells with a reference signal to form a data signal from the output signal from the respective one of the memory cells;
a reference generator circuit with inputs coupled to the outputs of the memory cells, and arranged to form the reference signal of the jointly addressable group of the memory cells;
wherein each respective one of the memory cells of the addressed group contributes a contribution that is a function of the output signal of the respective one of the memory cells, the reference generator implementing the function so that the contributions are equalized for output signal values at more than a saturating distance above the reference signal, and that the contributions are equalized for output signal values at more than the saturating distance below the reference signal.

2. A circuit according to claim 1, wherein the memory cells are programmable to levels selected from L different logic levels, L being an integer greater than two, the reference signal lying between nominal output signals for a pair of adjacent logic levels, the reference generator circuit being arranged so that at least the nominal output signals for the logic levels other than the adjacent logic levels lie more than said saturation distance from the reference signal.

3. A circuit according to claim 2, wherein the reference generator circuit is arranged so that the function varies substantially linearly as a function of output signals over at least half of a range between the nominal output signals for the adjacent logic levels.

4. A circuit according to claim 1, wherein reference generator circuit is arranged so that the contributions for output signal values at more than a saturating distance above the reference signal are equalized to a first level, and the contributions for output signal values at more than the saturating distance below the reference signal are equalized to a second level, the first and second level lying on mutually opposite sides of a nominal level that correspond to a function value that would occur if the output signal would equal the reference signal, there being a ratio unequal to one between distances from the nominal level to the first and second level respectively.

5. A circuit according to claim 4, wherein the cells are programmable to levels selected from L different logic levels, L being an integer greater than two, the reference signal lying between nominal output signals for k of lower ones of the logic levels and L−k higher ones of the logic levels, the ratio between the first and second distance being substantially equal to $k/(L-k)$.

6. A circuit according to claim 4, wherein contents of the memory cells have been programmed to levels selected from L different logic levels, L being an integer greater than two, the reference signal lying between nominal output signals for k of lower ones of the logic levels and L−k higher ones of the logic levels, a first count of memory cells in each group of jointly addressable memory cells having been programmed to levels from the k lower levels and a second count of memory cells in each group of jointly addressable cells having been programmed to levels of the L−k higher levels, the ratio between the first and second distance being substantially equal to the first count divided by the second count.

7. A circuit according to claim 4, wherein the sensing circuits are arranged to compare the output signal of each respective one of the memory cells of the addressed group with a plurality of reference signals, to form resulting data signals representing which one of at least three logic levels has been detected in the respective one of the cells, and wherein the reference generator circuit is arranged to form the plurality of reference signals from a plurality of sums, each respective one of the memory cells of the address group contributing respective contributions to the respective sums, wherein the contributions are respective functions of the output signal, said ratio being different for the functions for different reference levels.

8. A circuit according to claim 1, wherein the reference generator circuit is arranged to form the contribution as a function of a difference between the output signal of the respective ones of the memory cells and the reference signal, the reference generator circuit comprising a feedback loop for regulating the reference signal to a value so that the sum substantially assumes a predetermined value.

9. A circuit according to claim 8, wherein the feedback loop has an integrating transfer function.

10. A circuit according to claim 1, comprising
bit lines coupled to columns of memory cells;
saturating circuits, each with an input coupled to a respective one of the bit lines, arranged to output contribution signals that depend on the output signals according to said function;
a summing circuit, with inputs coupled to the saturating circuits and arranged to receive said contributions, and an output coupled to the sensing circuits for controlling the reference signal.

11. A circuit according to claim 10, wherein at least part of the saturating circuits each comprise a current source and a first and second transistor, both with a source electrode coupled to the current source and a drain electrode coupled to the summing circuit, the first transistor having a gate electrode coupled to the bit line, the second transistor having a gate electrode coupled to receive a common signal value that is common to all of the saturating circuits for a same reference level.

12. A circuit according to claim 11, wherein the common signal value corresponds to the reference signal.

13. A circuit according to claim 12, wherein the summing circuit comprises a current subtraction circuit, arranged to subtract a current in proportion to a first current from the drain electrode of the first transistor from a current in proportion to a second current from the drain electrode of the second transistor, an output of the subtraction circuit being coupled to the sensing circuit for controlling the reference signal.

14. A circuit according to claim 13, wherein the subtraction circuit is arranged so that a first ratio between the current in proportion to the first current and the current in proportion to a second current differs from a second ratio between the first and second current.

15. A circuit according to claim 13, wherein the circuit provides for storing logic levels that are selected from L available logic levels in the cells, a ratio between the first and second factor being k to L−k, wherein k is an integer between zero and L.

16. A circuit according to claim 10, wherein the sensing circuits comprise the saturating circuits, the sensing circuits comprising a current subtraction circuit, arranged to subtract a first current determined by a current from the drain electrode of the first transistor from a second current determined by a current from the drain electrode of the second transistor, an output of the subtraction circuit being coupled to a data output of the sensing circuit.

17. A method of reading data from a memory matrix, the method comprising addressing a group of memory cells from the matrix;

comparing output signals from the cells of the addressed group with a reference signal;

forming digital data signals from the results of said comparing;

forming a sum of contributions that each are a function of the output signal of a respective one of the cells from the group of cells, the function being so that the contributions are equalized for output signal values at more than a saturating distance above the reference signal, and that the contributions are equalized for output signal values at more than the saturating distance below the reference signal;

selecting the reference signal under control of the sum.

* * * * *